(12) United States Patent
Lee et al.

(10) Patent No.: US 12,009,039 B2
(45) Date of Patent: Jun. 11, 2024

(54) ERROR COMPENSATION CIRCUIT FOR ANALOG CAPACITOR MEMORY CIRCUITS

(71) Applicant: Korea University Research and Business Foundation, Seoul (KR)

(72) Inventors: Hyung-Min Lee, Seoul (KR); Minil Kang, Seoul (KR); Min-Seong Um, Seoul (KR)

(73) Assignee: Korea University Research and Business Foundation, Seoul (KR)

( * ) Notice: Subject to any disclaimer, the term of this patent is extended or adjusted under 35 U.S.C. 154(b) by 147 days.

(21) Appl. No.: 17/851,696

(22) Filed: Jun. 28, 2022

(65) Prior Publication Data
US 2023/0041306 A1    Feb. 9, 2023

(30) Foreign Application Priority Data

Aug. 6, 2021   (KR) .................. 10-2021-0103839

(51) Int. Cl.
*G11C 27/00*      (2006.01)
*G06N 3/063*      (2023.01)

(52) U.S. Cl.
CPC ............ *G11C 27/00* (2013.01); *G06N 3/063* (2013.01)

(58) Field of Classification Search
CPC .......... G11C 11/54; G11C 11/565; G11C 2029/0409; G11C 27/026; G11C 29/52; G11C 7/02; G11C 11/40611; G11C 11/4096

See application file for complete search history.

(56) References Cited

U.S. PATENT DOCUMENTS

| 5,726,936 A | 3/1998 | Whitfield |
| 2023/0196979 A1* | 6/2023 | Cok .......................... G09G 3/32 345/55 |
| 2023/0317125 A1* | 10/2023 | Matsuzaki .......... G11C 11/4096 365/189.16 |

FOREIGN PATENT DOCUMENTS

| KR | 10-0904753 B1 | 6/2009 |
| KR | 10-0992160 B1 | 11/2010 |
| KR | 10-1085908 B1 | 11/2011 |
| KR | 10-1212269 B1 | 1/2013 |
| KR | 10-2020-0135148 A | 12/2020 |

* cited by examiner

*Primary Examiner* — Ajay Ojha
(74) *Attorney, Agent, or Firm* — NSIP Law (57) ABSTRACT

An error compensation circuit for analog capacitor memory circuits includes a first transistor and a second transistor with gates connected respectively to top and bottom of an analog memory capacitor to read a voltage charged in the analog memory capacitor; a first switch and a second switch connected respectively to the first transistor and the second transistor to select the voltage to read; a first capacitor and a second capacitor to charge an electric charge to compensate or refresh the analog memory capacitor according to on/off of the first switch and the second switch; and an input terminal connected to sources of the first transistor and the second transistor to apply the voltage to operate the circuit. Accordingly, it is possible to compensate for an unintended phenomenon of the analog capacitor memory or refresh a change in memory value caused by leakage.

10 Claims, 8 Drawing Sheets

FIG. 1

Conventional art

FIG. 2

Conventional art

FIG. 3

Conventional art

ERROR COMPENSATION CIRCUIT FOR ANALOG CAPACITOR MEMORY CIRCUITS

CROSS-REFERENCE TO RELATED APPLICATION

This application claims priority to Korean Patent Application No. 10-2021-0103839, filed on Aug. 6, 2021, and all the benefits accruing therefrom under 35 U.S.C. § 119, the contents of which in its entirety are herein incorporated by reference.

BACKGROUND

1. Field

The present disclosure relates to an error compensation device for analog capacitor memory circuits, and more particularly, to circuitry for circuits using analog capacitor memory for compensating for an unintended phenomenon caused by another circuit connected to the corresponding capacitor memory, thereby refreshing a change in stored value caused by leakage of the analog capacitor memory or compensating for a non-ideal write operation caused by another circuit connected to the capacitor memory.

2. Description of the Related Art

With the development of not only complementary metal-oxide semiconductor (CMOS) process technology but also circuit technology, circuits using analog capacitor memory are increasing. Typically, they are used to store an analog value that is an input of an analog digital converter in a capacitor and convert the analog value to a digital value. Additionally, recently, neuromorphic studies to store and calculate analog data values in capacitors have been developed so much.

As opposed to a digital value which is distinguished between two values 0 and 1, an analog value exists as a continuous value and thus is easily affected by many various factors. That is, analog values stored in capacitors may be easily changed by external factors (an electromagnetic field, a magnetic field, radiation, etc.) and internal factors (leakage current to peripheral circuits or metal oxide semiconductor field effect transistor (MOSFET)).

In a short time, there is a small change in analog value caused by leakage current, but at millisecond level that can be recognized by human, in many cases, a change in analog value caused by leakage current becomes significant. In this case, accurate computing is impossible, and small errors accumulate, resulting in a large error.

Figure 1:
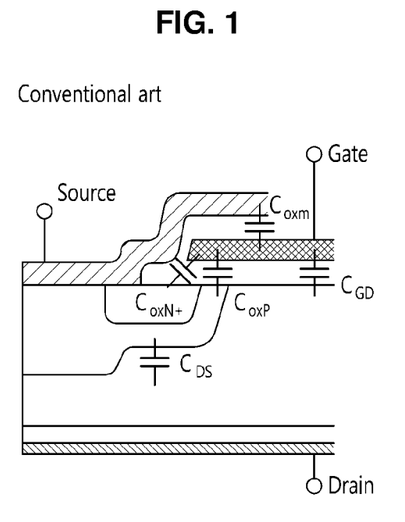
FIG. 1 is a diagram illustrating a parasitic capacitor in a metal oxide semiconductor field effect transistor (MOSFET).

Additionally, there are non-ideal factors in MOSFET connected to the capacitor by unwanted parasitic capacitor. FIG. 1 shows the parasitic capacitor in the MOSFET. Various parasitic capacitors exist in the MOSFET, and the components of the parasitic capacitors differ depending on the fabrication process and the size.

When the gate voltage increases, electric charge is charged in the parasitic capacitor by as much as the voltage. Subsequently, when the gate voltage decreases, the electric charge stored in the parasitic capacitor leaks away and may be charged in the capacitor memory. In some cases, the circuit performs an unwanted operation due to the charging and discharging of the electric charge in the parasitic capacitor.

The parasitic capacitor of the MOSFET increases with the increasing size of the MOSFET, and as the capacitor size of the capacitor memory decreases, the unwanted effect increases. As the size of the capacitor memory increases, a larger area is needed, resulting in inefficiency. Additionally, since the size of the MOSFET is set according to the desired functions (the amount of current, the amount of voltage, the magnitude of resistance, etc.), it is not easy to reduce the size of the MOSFET.

Figure 2:
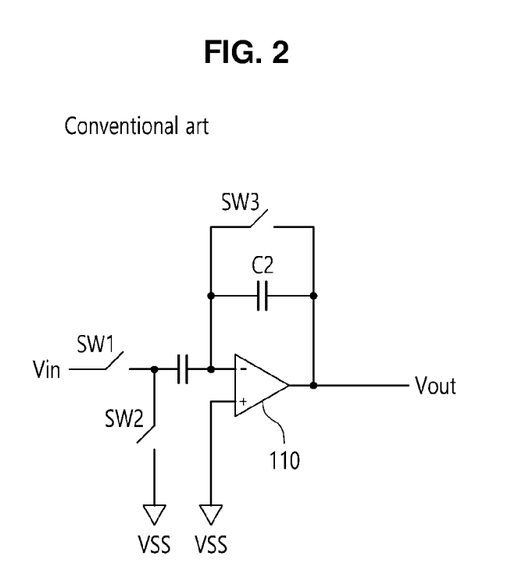
FIG. 2 shows an example of an analog circuit using capacitor memory.

FIG. 2 shows an example of an analog circuit using capacitor memory. SW1, SW2, SW3 are all switches and implemented as a MOSFET, and an amplifier (AMP) 110 is also implemented as a MOSFET, a resistor and a capacitor. The switched capacitor circuit operates in two modes, a sampling mode and an amplification mode.

To perform an accurate operation in the sampling mode, it is necessary to store precise analog data in C1, but an undesired operation often occurs due to the parasitic capacitor of AMP and the parasitic capacitor of SW. In addition, the electric charge of C1 is carried to C2 in the amplification mode, but there are problems due to various parasitic capacitors. As a result, there are non-ideal effects caused by the parasitic capacitor, which may change the analog memory value.

Figure 3:
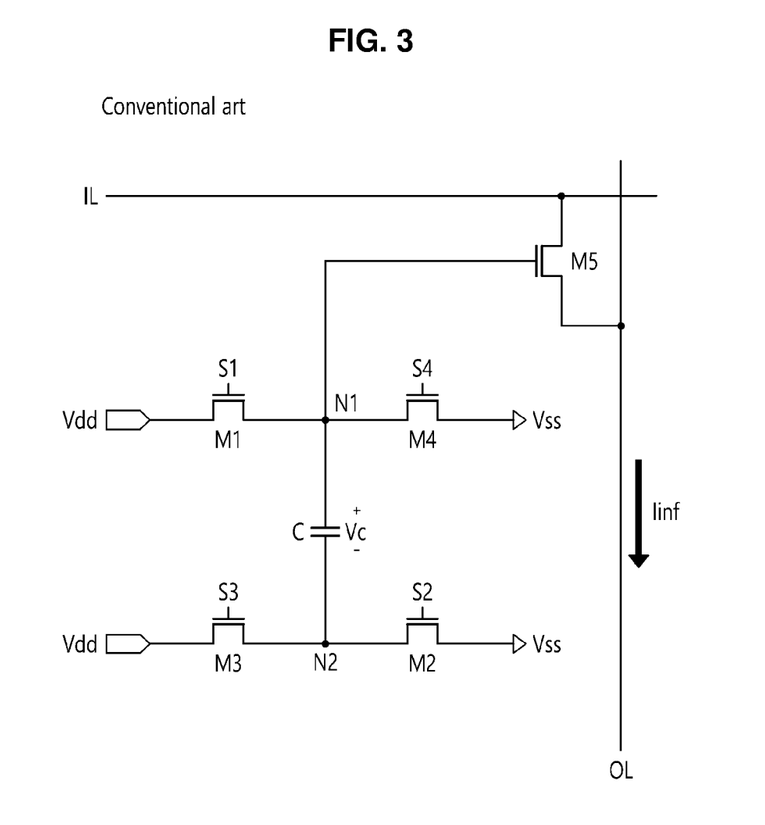
FIG. 3 shows an example of a synapse mimicking device used in neuromorphic.

FIG. 3 shows an example of a synapse mimicking device used in neuromorphic. In this instance, the capacitor C charges up through M1, M2, M3 and M4, and M5 acts as a variable resistor. However, when MOSFET devices are connected to the capacitor, the effect by the parasitic capacitor takes place during the operation of the MOSFET devices.

Additionally, in the case of neuromorphic, learning is undertaken for a long term, and afterwards, the learning results are continuously maintained and used, and when there is a change in the amount of electric charge stored in the capacitor, the result of neuromorphic changes. This may lead to a crucial result when used in artificial intelligence circuits such as unmanned vehicles. Accordingly, there is a need for a circuit for preventing or compensating for leakage.

RELATED LITERATURES

Patent Literature (Patent Literature 0001) KR 10-1212269 B1
(Patent Literature 0002) KR 10-2020-0135148 A

SUMMARY

The present disclosure is designed to solve the above-described technical problem, and therefore the present disclosure is directed to providing an error compensation circuit for analog capacitor memory circuits for compensating for an unintended phenomenon of analog capacitor memory or refreshing a change in memory value caused by leakage.

To achieve the above-described object of the present disclosure, an error compensation circuit for analog capacitor memory circuits according to an embodiment includes a first transistor and a second transistor with gates connected respectively to top and bottom of an analog memory capacitor to read a voltage charged in the analog memory capacitor; a first switch and a second switch connected respectively to the first transistor and the second transistor to select the voltage to read; a first capacitor and a second capacitor to charge an electric charge to compensate or refresh the analog memory capacitor according to on/off of the first switch and the second switch; and an input terminal connected to sources of the first transistor and the second transistor to apply the voltage to operate the circuit.

In an embodiment of the present disclosure, the error compensation circuit for analog capacitor memory circuits may further include a third switch and a fourth switch to determine a power line for charging the first capacitor and the second capacitor.

In an embodiment of the present disclosure, a first signal may be applied to the third switch and the second switch, and a second signal may be applied to the fourth switch and the second switch.

In an embodiment of the present disclosure, when the first signal is applied to the circuit, the voltage charged in the second capacitor may be applied to the analog memory capacitor to refresh a stored value.

In an embodiment of the present disclosure, an amount of electric charge may be supplied as much as a difference in the voltage applied to the first capacitor at a size ratio of the first capacitor and the analog memory capacitor to compensate for the analog memory capacitor.

In an embodiment of the present disclosure, when the second signal is applied to the circuit, the voltage charged in the first capacitor may be applied to the analog memory capacitor to refresh a stored value.

In an embodiment of the present disclosure, an amount of electric charge may be supplied as much as a difference of the voltage applied to the second capacitor at a size ratio of the second capacitor and the analog memory capacitor to compensate for the analog memory capacitor.

In an embodiment of the present disclosure, the error compensation circuit for analog capacitor memory circuits may further include a fifth switch and a sixth switch to block interference between the analog memory capacitor and a peripheral circuit.

In an embodiment of the present disclosure, the input terminal may apply a voltage of VDD or 0.

In an embodiment of the present disclosure, the error compensation circuit for analog capacitor memory circuits may be connected to an external circuit.

According to the error compensation circuit for analog capacitor memory circuits, it is possible to store accurate values by compensating for unintended effects by peripheral circuits such as metal oxide semiconductor field effect transistors (MOSFETs). Additionally, it is possible to maintain existing values by refreshing memory changes caused by leakage, thereby ensuring higher performance in analog systems such as neuromorphic systems.

DETAILED DESCRIPTION

The following detailed description of the present disclosure is made with reference to the accompanying drawings, in which particular embodiments for practicing the present disclosure are shown for illustrative purposes. These embodiments are described in sufficiently detail for those skilled in the art to practice the present disclosure. It should be understood that various embodiments of the present disclosure are different but do not need to be mutually exclusive. For example, particular shapes, structures and features described herein in connection with one embodiment may be implemented in other embodiment without departing from the spirit and scope of the present disclosure. It should be further understood that changes may be made to the positions or placement of individual elements in each disclosed embodiment without departing from the spirit and scope of the present disclosure. Accordingly, the following detailed description is not intended to be taken in limiting senses, and the scope of the present disclosure, if appropriately described, is only defined by the appended claims along with the full scope of equivalents to which such claims are entitled. In the drawings, similar reference signs denote same or similar functions in many aspects.

Hereinafter, preferred embodiments of the present disclosure will be described in more detail with reference to the accompanying drawings.

Figure 4:
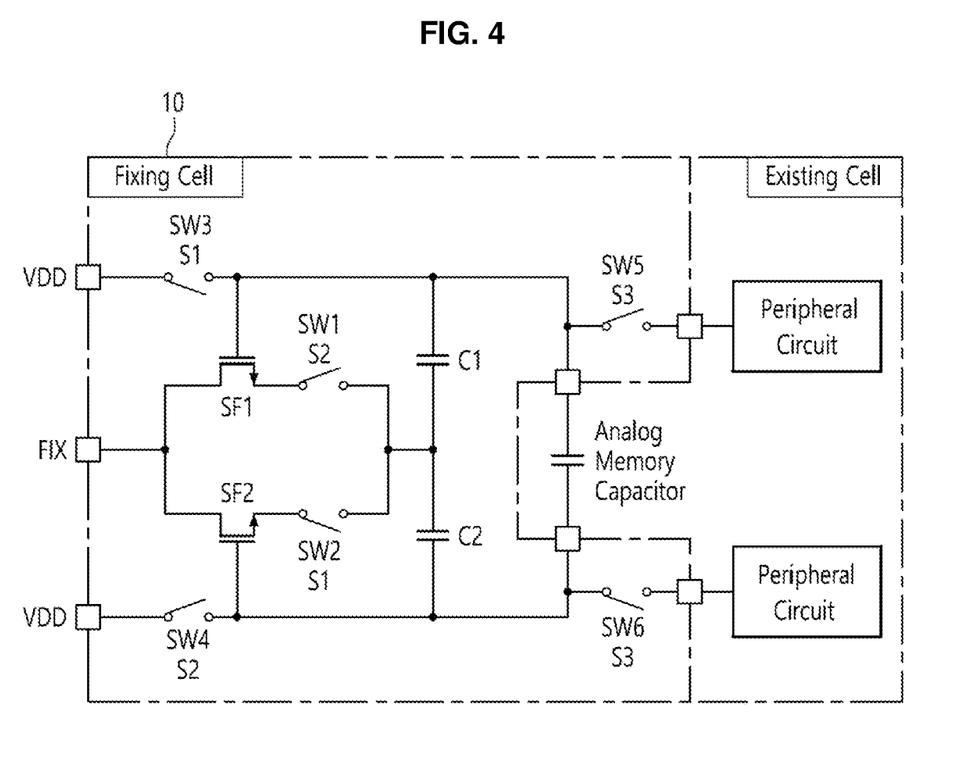
FIG. 4 is a circuit diagram of an error compensation circuit for analog capacitor memory circuits according to an embodiment of the present disclosure.

FIG. 4 is a circuit diagram of an error compensation circuit for analog capacitor memory circuits according to an embodiment of the present disclosure.

The error compensation circuit 10 for analog capacitor memory circuits (a fixing cell, hereinafter the error compensation circuit) according to the present disclosure is configured to compensate for an unintended phenomenon of the existing analog capacitor memory or refresh a change in memory value caused by leakage.

The error compensation circuit 10 of the present disclosure may be connected to the existing external cell (peripheral circuit) for use. Accordingly, the present disclosure may use the existing analog memory capacitor without any change.

The error compensation circuit 10 may constitute a separate module or a part of the module. Alternatively, the error compensation circuit 10 may be formed on a substrate or provided in the form of a device.

Referring to FIG. 4, the error compensation circuit 10 according to an embodiment of the present disclosure includes a first transistor SF1 and a second transistor SF2 for reading voltage charged in the analog memory capacitor, a first switch SW1 and a second switch SW2 respectively connected to the first transistor SF1 and the second transistor SF2 to select voltage to read, a first capacitor C1 and a second capacitor C2 to charge an amount of electric charge for compensating or refreshing in the analog memory capacitor, and an input terminal FIX to apply voltage for operating the circuit.

In other embodiment, the error compensation circuit 10 may further include a third switch SW3 and a fourth switch SW4 to determine the connection of a power line for charging the first capacitor C1 and the second capacitor C2.

A first signal S1 is applied to the third switch SW3 and the second switch SW1, and a second signal S2 is applied to the fourth SW4 and the second switch SW2.

Additionally, the error compensation circuit 10 may further include a fifth switch SW5 and a sixth switch SW6 to connect to the existing circuit.

First, the analog memory capacitor can be charged from the existing peripheral circuit connected thereto. Subsequently, the error compensation circuit 10 performs compensation and refresh. In this instance, to eliminate the interference of the peripheral circuit, the connection of the fifth switch SW5 and the sixth switch SW6 is disconnected.

In case that the peripheral circuit has a switch for disconnecting the connection to the analog memory capacitor, the corresponding switch may be used without forming the fifth switch SW5 and the sixth switch SW6 in the error compensation circuit 10.

To read the top and bottom voltage from the analog memory capacitor charged through the existing peripheral circuit, the top and bottom of the analog memory capacitor are connected to the gate voltage of the first transistor SF1 and the second transistor SF2, respectively.

When the signal of the input terminal FIX applies high voltage of VDD, the first transistor SF1 and the second transistor SF2 work as a source follower, so the source voltage has a voltage that is lower than the voltage of the memory capacitor by threshold voltage.

Meanwhile, the signal of the input terminal FIX does not keep applying only high voltage of VDD, and signal 0 is sent for initialization. This guarantees the operation of the first transistor SF1 and the second transistor SF2. It is because the first transistor SF1 and the second transistor SF2 do not operate when the source voltage of the first transistor SF1 and the second transistor SF2 is higher than the analog memory capacitor.

Figure 5:
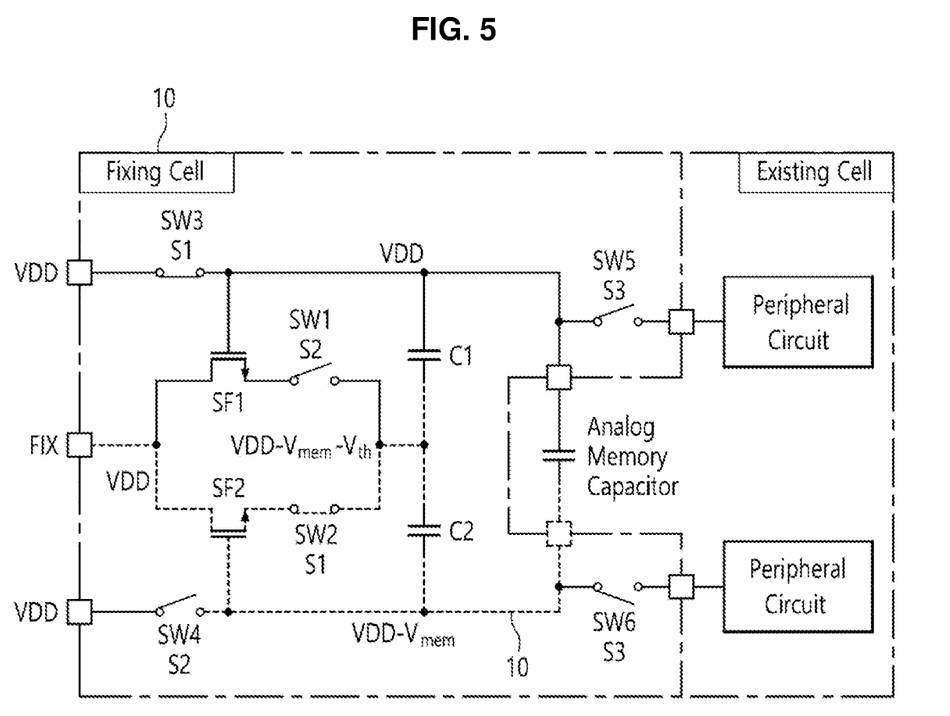
FIG. 5 is a diagram illustrating a compensation and refresh process in case of operation by the signal S1 of FIG. 4.

FIG. 5 is a diagram illustrating a compensation and refresh process in case of operation by the signal S1 of FIG. 4.

When the circuit operates by the signal S1 applied, the circuit becomes the state of FIG. 5. Assume that voltage charged in the analog memory capacitor is $V_{mem}$. The third switch SW3 turns on and VDD is applied as the voltage of the upper part of the analog memory capacitor.

The lower part of the analog memory capacitor is in floating state (not directly connected to the voltage source) so there is nowhere for the electric current to flow, and the voltage of VDD$-V_{mem}$ is held by the voltage of the upper part and the amount of stored electric charge.

Thus, the voltage between the first capacitor C1 and the second capacitor C2 across the second transistor SF2 is determined to be VDD$-V_{mem}-V_{th}$ that is lower by the threshold voltage.

In this instance, the first capacitor C1 is connected from VDD and the input terminal FIX at top and bottom and thus is charged as much as $V_{mem}+V_{th}$. The second capacitor C2 is only connected at top and is floating at bottom, and thus the amount of electric charge of the second capacitor C2 enters the analog memory capacitor.

Figure 6:
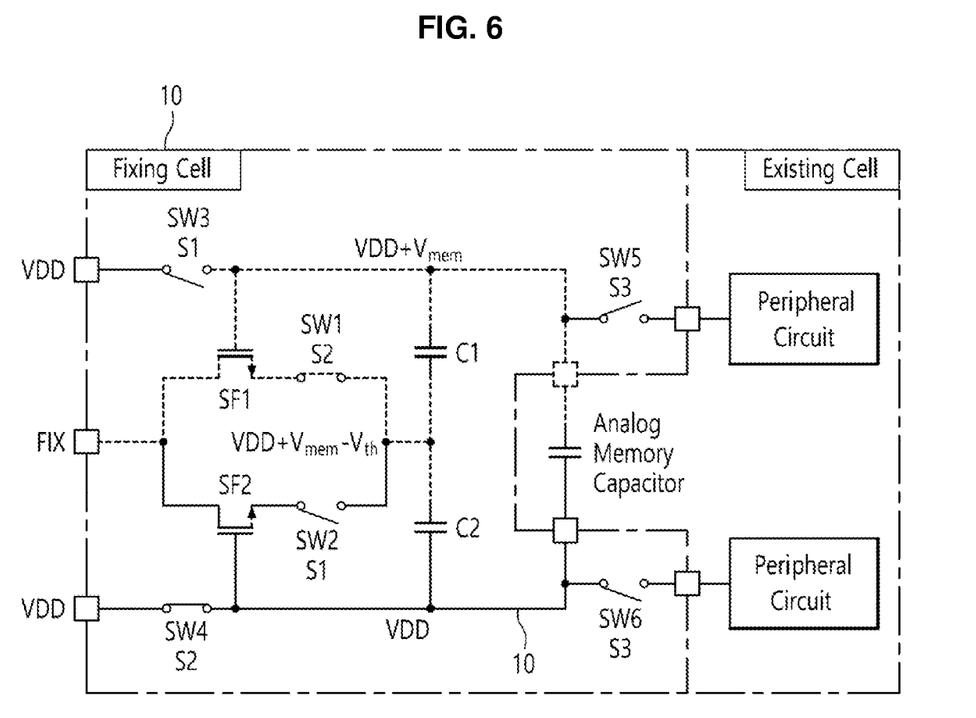
FIG. 6 is a diagram illustrating a compensation and refresh process in case of operation by the signal S2 of FIG. 4.

FIG. 6 is a diagram illustrating a compensation and refresh process in case of operation by the signal S2 of FIG. 4.

Subsequently, when the circuit operates by the signal S2 applied, the circuit becomes the state of FIG. 6. The fourth switch SW4 turns on and VDD is applied as the voltage of the lower part of the analog memory capacitor.

The upper part of the analog memory capacitor is in floating state so there is nowhere for the electric current to flow, and the voltage of VDD+$V_{mem}$ is held by the voltage of the upper part and the amount of stored electric charge.

Accordingly, the voltage between the first capacitor C1 and the second capacitor C2 across the first transistor SF1 is determined to be VDD+$V_{mem}-V_{th}$ that is lower by the threshold voltage.

In this instance, the second capacitor C2 is connected from VDD and the input terminal FIX at top and bottom and is charged as much as $V_{mem}-V_{th}$. The first capacitor C1 is only connected at bottom and is floating at top, and thus the amount of electric charge of the first capacitor C1 enters the analog memory capacitor.

Meanwhile, in the case of the first capacitor C1, the amount of electric charge in the state of FIG. 5 in which the previous signal S1 is applied is $V_{mem}+V_{th}$. However, the voltage of the upper part of the first capacitor C1 in the state in which S2 is applied is VDD+$V_{mem}$ and the voltage of the lower part is VDD+$V_{mem}-V_{th}$. That is, in the present situation, the amount of electric charge remaining in the first capacitor C is $V_{th}$.

Accordingly, the $V_{mem}$ value as a result of subtracting the value of $V_{th}$ to be left from the value of the already charged $V_{mem}+V_{th}$ is charged in the analog memory capacitor. To be more accurate, the electric charge is shared at the capacitor size ratio of the first capacitor C1 and the analog memory capacitor.

Additionally, in the case of the second capacitor C2, the amount of electric charge in the state of FIG. 6 in which the previous signal S2 is applied is $V_{mem}-V_{th}$. However, the voltage of the lower part of the second capacitor C2 in the state in which S1 is applied is VDD$-V_{mem}$ and the voltage of the upper part is VDD$-V_{mem}-V_{th}$. That is, in the present situation, the amount of electric charge remaining in the second capacitor C2 is $-V_{th}$.

Accordingly, the $V_{mem}$ value as a result of subtracting the value of $-V_{th}$ to be left from the value of the already charged $V_{mem}-V_{th}$ is charged in the analog memory capacitor. To be more accurate, the electric charge is shared at the capacitor size ratio of the second capacitor C2 and the analog memory capacitor.

The first capacitor C1 and the second capacitor C2 are only different in switch state and injection location, and their voltages that change are equal. That is, even when only one of the two is used, there is no problem with compensation and refreshing.

Figure 7:
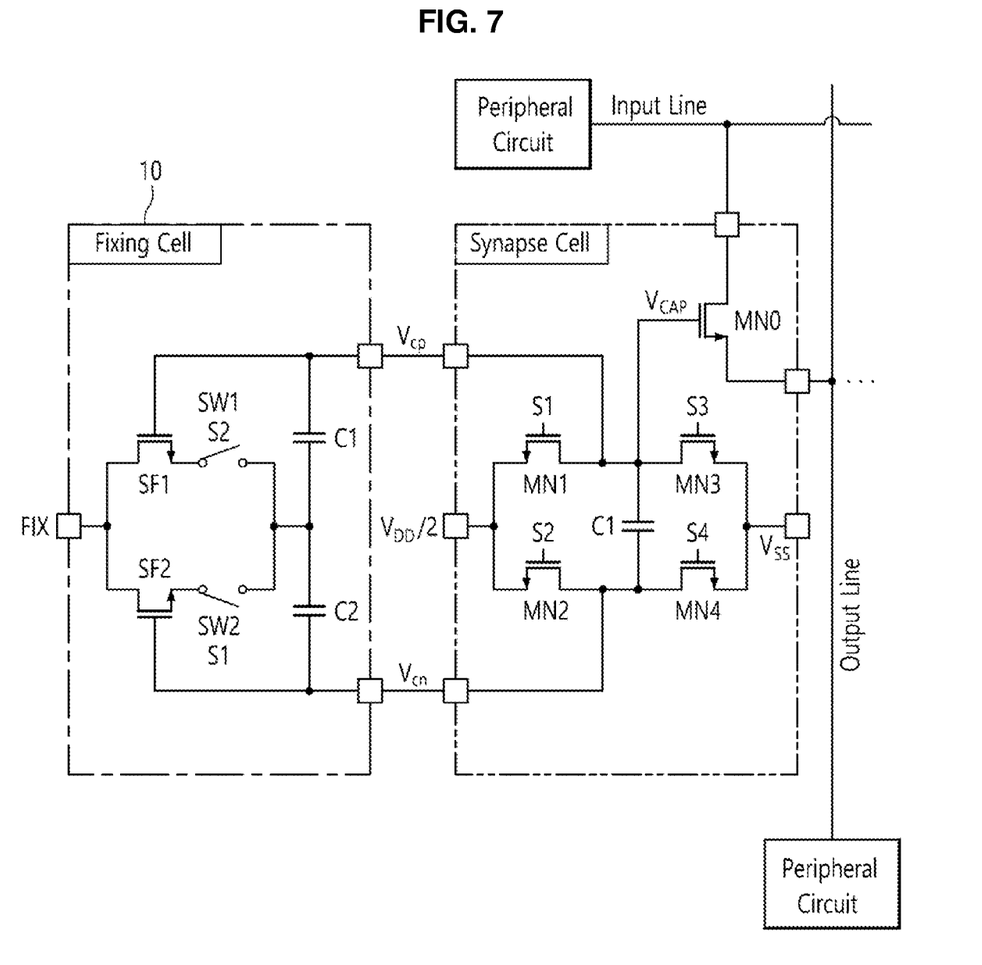
FIG. 7 is an exemplary diagram of a synapse mimicking device capable of neural network learning using the error compensation circuit of FIG. 4.

In this instance, when there is a voltage source to be connected to the peripheral circuit like the fifth switch SW5 and the sixth switch SW6, the third switch SW3 and the fourth switch SW4 may be used instead of VDD. That is, the fifth switch SW5 and the sixth switch SW6 may be used like the third switch SW3 and the fourth switch SW4, respectively. FIG. 7 shows such an example.

FIG. 7 is an exemplary diagram of a synapse mimicking device capable of neural network learning using the error compensation circuit of FIG. 4.

FIG. 7 shows the error compensation circuit 10 of the present disclosure added for compensation and refresh circuits to the analog capacitor memory of the synapse mimicking device capable of neural network learning of FIG. 3.

In this instance, MN1 of the synapse mimicking device acts as the third switch SW3 and MN2 acts as the fourth switch SW4, to apply the voltage of VDD/2. The voltage source may provide an amount of electric charge for charging, and the magnitude of voltage may be a numeric value for the operation of transistors.

Figure 8:
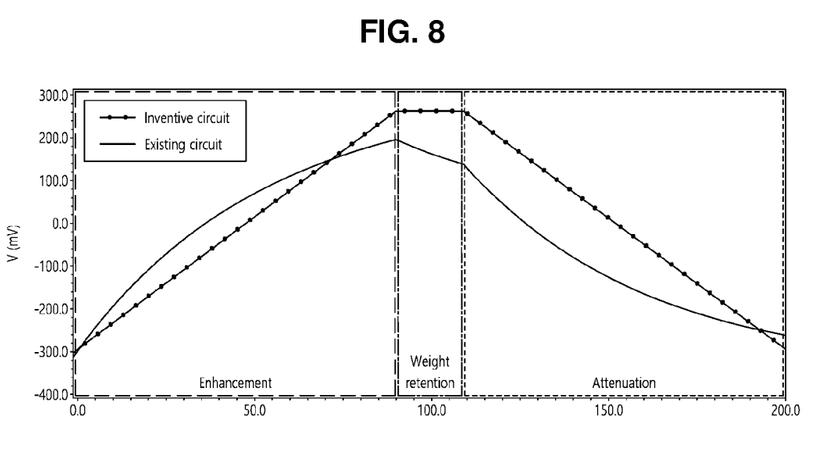
FIG. 8 is a diagram showing simulation results of an existing synapse mimicking device capable of neural network learning and a synapse mimicking device using an error compensation circuit of the present disclosure.

FIG. 8 shows simulation results of a synapse mimicking device (existing) capable of neural network learning and a synapse mimicking device (the present disclosure) using analog capacitor memory compensation and refresh circuit.

Referring to FIG. 8, the existing circuit is not linearly enhanced during enhancement since it is affected by other devices such as MN0, and the same case with attenuation. Additionally, after updates, it is not maintained and degraded by many phenomena.

However, it can be seen that the compensation circuit using the compensation and refresh circuit of the present disclosure ensures linearity and symmetry, and does not change for the retention period.

While the present disclosure has been hereinabove described with reference to the embodiments, those skilled in the art will understand that a variety of modifications and changes may be made thereto without departing from the spirit and scope of the present disclosure defined in the appended claims.

In analog capacitor memory, the present disclosure may be applied when it is necessary to refresh or compensate for the stored value of the analog capacitor memory by the influence of many devices. Accordingly, the present disclosure may be applied to a variety of semiconductor chip and circuit system products using analog capacitors, for example, neuromorphic circuits, deep learning hardware and machine learning systems.

DETAILED DESCRIPTION OF MAIN ELEMENTS

10: Error compensation circuit for analog capacitor memory circuits

What is claimed is:

1. An error compensation circuit for analog capacitor memory circuits, comprising:
    a first transistor and a second transistor with gates connected respectively to top and bottom of an analog memory capacitor to read a voltage charged in the analog memory capacitor;
    a first switch and a second switch connected respectively to the first transistor and the second transistor to select the voltage to read;
    a first capacitor and a second capacitor to charge an electric charge to compensate or refresh the analog memory capacitor according to on/off of the first switch and the second switch; and
    an input terminal connected to sources of the first transistor and the second transistor to apply the voltage to operate the circuit.

2. The error compensation circuit for analog capacitor memory circuits according to claim 1, further comprising:
    a third switch and a fourth switch to determine a power line for charging the first capacitor and the second capacitor.

3. The error compensation circuit for analog capacitor memory circuits according to claim 2, wherein a first signal is applied to the third switch and the second switch, and a second signal is applied to the fourth switch and the second switch.

4. The error compensation circuit for analog capacitor memory circuits according to claim 3, wherein when the first signal is applied to the circuit, the voltage charged in the second capacitor is applied to the analog memory capacitor to refresh a stored value.

5. The error compensation circuit for analog capacitor memory circuits according to claim 4, wherein an amount of electric charge is supplied as much as a difference in the voltage applied to the first capacitor at a size ratio of the first capacitor and the analog memory capacitor to compensate for the analog memory capacitor.

6. The error compensation circuit for analog capacitor memory circuits according to claim 3, wherein when the second signal is applied to the circuit, the voltage charged in the first capacitor is applied to the analog memory capacitor to refresh a stored value.

7. The error compensation circuit for analog capacitor memory circuits according to claim 6, wherein an amount of electric charge is supplied as much as a difference of the voltage applied to the second capacitor at a size ratio of the second capacitor and the analog memory capacitor to compensate for the analog memory capacitor.

8. The error compensation circuit for analog capacitor memory circuits according to claim 1, further comprising:
    a fifth switch and a sixth switch to block interference between the analog memory capacitor and a peripheral circuit.

9. The error compensation circuit for analog capacitor memory circuits according to claim 1, wherein the input terminal applies a voltage of VDD or 0.

10. The error compensation circuit for analog capacitor memory circuits according to claim 1, which is connected to an external circuit.

* * * * *